United States Patent [19]

Chen et al.

[11] Patent Number: 5,998,286
[45] Date of Patent: Dec. 7, 1999

[54] METHOD TO GROW SELF-ALIGNED SILICON ON A POLY-GATE, SOURCE AND DRAIN REGION

[75] Inventors: Shu-Jen Chen, Hsinchu; Jacky Kuo, Taipei; Jiunn-Hsien Lin, Yung Kang; Chih-Ching Hsu, Hsinchu, all of Taiwan

[73] Assignee: United Semiconductor Circuit Corp., Hsinchu, Taiwan

[21] Appl. No.: 09/048,924

[22] Filed: Mar. 26, 1998

[51] Int. Cl.$^6$ .................................................. H01L 21/283
[52] U.S. Cl. .................... 438/586; 438/303; 438/299; 438/592; 438/630; 438/649; 438/647; 438/651; 438/655; 438/657; 438/664; 438/682; 438/684
[58] Field of Search .................... 438/592, 586, 438/630, 647, 649, 655, 657, 664, 682, 683, 684, 581, 583, 299–307

[56] References Cited

U.S. PATENT DOCUMENTS

| | | | |
|---|---|---|---|
| 4,701,349 | 10/1987 | Koyanagi et al. | 427/228 |
| 4,974,056 | 11/1990 | Brodsky et al. | 357/71 |
| 4,983,544 | 1/1991 | Lu et al. | 438/698 |
| 5,138,432 | 8/1992 | Stanasolovich et al. | 357/71 |
| 5,217,923 | 6/1993 | Suguro | 438/305 |
| 5,665,646 | 9/1997 | Kitano | 438/592 |
| 5,679,585 | 10/1997 | Gardner et al. | 438/655 |
| 5,759,899 | 1/1996 | Saito | 438/303 |
| 5,830,775 | 11/1996 | Maa et al. | 148/DIG. 19 |
| 5,851,921 | 4/1997 | Gardner et al. | 438/655 |

*Primary Examiner*—Charles Bowers
*Assistant Examiner*—Thanh Nguyen
*Attorney, Agent, or Firm*—Merchant & Gould, P.C.

[57] ABSTRACT

The method of the present invention includes forming a MOS on a semiconductor substrate. Subsequently, a silicon-rich metal silicide layer is deposited on the MOS and substrate by using chemical vapor deposition to act as a silicon material source. Then, a thermal process is carried out to separate a portion of the silicon out of the metal silicide layer, thereby forming a silicon layer on top of the gate of the MOS, source/drain. The nest step is to remove the metal suicide layer. A self-aligned metal silicide layer is formed on the silicon layer.

27 Claims, 2 Drawing Sheets

METHOD TO GROW SELF-ALIGNED SILICON ON A POLY-GATE, SOURCE AND DRAIN REGION

FIELD OF INVENTION

The present invention relates to a semiconductor process, and more specifically, to a method of growing self-align silicon on the gate, the source and drain of a metal oxide semiconductor field effect transistor (MOSFET) for used in deep sub-micron meter range.

BACKGROUND OF THE INVENTION

Integrated circuits includes more than millions devices in a specific area of a wafer and electrically connecting structure for connecting these devices to perform desired function. In order to achieve high performance integrated circuits or high package density of a wafer, the sizes of semiconductor devices have become smaller and smaller than before in the field of Ultra Large Scale Integrated (ULSI) technologies.

One of the typical devices is metal oxide semiconductor (MOS) field effect transistor. The MOS has been widely, traditionally applied in the semiconductor technologies. As well known in the art, the MOS includes a gate, a source and a drain. Similarly, in order to obtain high performance MOSFET, the MOS devices dimensions are continuously decreased to meet the requirement of the trend. Typically, the requirement of the devices towards high operation speed and low operation power. The devices are generally influenced by the RC delay and the source and drain resistance. For deep sub-micron meter MOS devices, the self-aligned silicide (SALICIDE) contacts are used for improving the operation speed.

Prior art proposed a high performance CMOS with $CoSi_2$, NiSi as silicide for deep sub-micron high speed CMOS due to the low sheet resistance of fine silicide line. Self-aligned Ti silicided gate, source and drain process is one of the method for lowering the gate electrode sheet resistance and the source and drain resistance.

In conventional process for forming the SALICIDE on source and drain. A metal is typically formed on the surface of the substrate. For example, a metal layer, such as Ti, Pt, Co, W, Ni etc, is sputtered on the substrate, the gate structure. Then, a rapid thermal annealing (RTA) at 350 to 700 degrees centigrade is performed to react the metal with the gate and the substrate. Then, a stripping step is used to remove non-reactive refractory metal on the side wall spacers of the gate. Therefore, the SALICIDE layer, polycide layer are self-aligned formed on these regions. However, the SALICIDE on the source and drain will be formed into a portion of the substrate to a certain depth due to the silicon reacts with the metal. Generally speaking, this will cause junction leakage due to the depth of the source and drain junctions become too shallow. For deep sub-micron meter devices, this issue becomes more serious than ever.

SUMMARY OF THE INVENTION

The method of the present invention includes forming a gate structure on a semiconductor substrate. A lightly doped drain, spacers and source/drain are respectively formed by using conventional manner. Subsequently, a silicon-rich metal silicide layer is deposited on the gate structure and substrate by using chemical vapor deposition to act as a silicon material source. The silicon-rich metal silicide layer could be formed of tungsten silicide ($WSi_x$) or $TiSi_2$.

Then, a thermal process is carried out to separate a portion of the silicon out of the metal silicide layer. The separated silicon is then formed on top of the polysilicon gate, source/drain to form a silicon layer on there regions. The nest step is to remove the metal silicide layer. The silicon layer is used to react with metal for forming subsequent silicide. A metal layer is sputtered on the silicon layer. Then, a step rapid thermal annealing (RTA) is performed at 350 to 700 centigrade degrees in $N_2$ ambient to react the metal with the self-aligned silicon layer, thereby forming self-aligned silicide, polycide on these portions. Then, a strip step is used to remove non-reactive metal on the side-wall spacers.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention proposes a novel method to fabricate a self-aligned silicon on the gate, the source and drain for subsequently self-align silicide (SALICIDE) contact. By using the technology, not only the device operation speed can be increased, but also the junction leakage will be eliminated.

Figure 1:
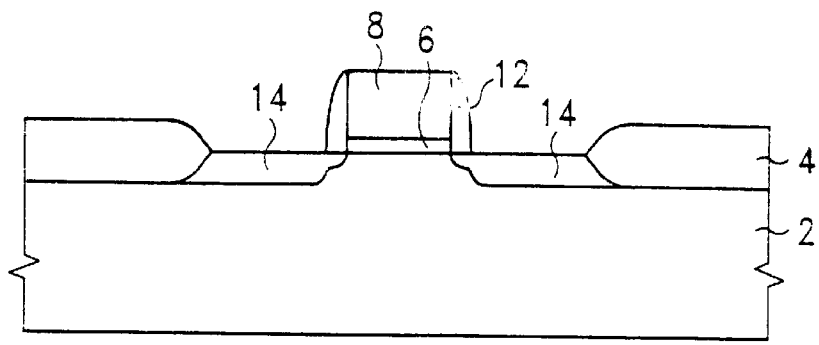
FIG. 1 is a cross section view of a semiconductor wafer illustrating the steps of forming a metal oxide semiconductor transistor on a semiconductor substrate according to the present invention.

Referring to FIG. 1, an embodiment of the present invention is now described. According to the embodiment, a single crystal silicon substrate 2 with a <100>crystallographic orientation is provided. Thick field oxide (FOX) regions 4 are formed to provide isolation between devices on the substrate. The FOX regions 4 can be formed via lithography and etching steps to etch a silicon nitride-silicon dioxide composition layer. After the photoresist is removed and wet cleaned, thermal oxidation in steam environment is used to grow the FOX regions 4. The FOX regions 4 can be replaced by a plurality of shallow trench isolations, as well known in the art.

The next steps are to fabricate a semiconductor transistor on the substrate 2, which is similar to the prior art. For example, a silicon dioxide layer 6 is formed on the top surface of the substrate 2 to serve as a gate oxide of a subsequently formed MOS transistor. Preferably, the silicon dioxide layer 6 is formed in oxygen ambient at a temperature of about 800 to 1100 degrees centigrade. The thickness of the silicon dioxide layer 6 is approximately 15–250 angstroms. Alternatively, the oxide layer 6 may be formed by using chemical vapor deposition.

A polysilicon layer 8 is then formed on the FOX regions 4 and the silicon dioxide layer 6 using a low pressure chemical vapor deposition process. In preferred embodiment, the polysilicon layer 8 is deposited on the gate oxide layer 6 at a temperature as the prior art. The thickness of the polysilicon 8 is about 1000 to 4000 angstroms. Further, an anti-reflective coating (ARC) layer (not shown) can be optionally formed on the polysilicon layer 8 to improve the resolution of lithography.

Next, standard lithography and etching steps are used to etch the ARC layer (if exist), the polysilicon layer 8 and silicon oxide 6 for forming a gate structure consisting of the gate oxide 6 and the polysilicon gate 8. The source/drain structure of the MOS may now be fabricated by the following steps. Still turning to FIG. 1, it illustrates the formation of the an N channel MOS device. However, it is well understood by those skill in the art that a P channel MOS could be formed by simply substituting opposite dopants to those given for the N channel MOS. Further, CMOS MOS could be formed in a similar way. For example, lightly doped drain 10 is formed by a conventional ion implantation with n conductive type dopants such as phosphorus at a dose between about 1 to 10E 13 atoms/cm$^2$, and with an energy of between about 30–80 KeV.

A dielectric layer is then formed on the gate structure and on the substrate 2 followed by the completion of the lightly doped drain 10. Typically, this can be achieved by a deposition with silane based low pressure chemical vapor deposition. Alternatively, an oxide using tetraethoxysilane (TEOS) as the reaction material could be used as the dielectric layer. An anisotropic etching of the dielectric layer to form side wall spacers 12 on the side walls of the gate structure. Then, N+ source/drain ion implantation with arsenic is performed to form the source and drain 14 in the substrate 2 using the gate structure and spacers 12 as a mask.

Figure 2:
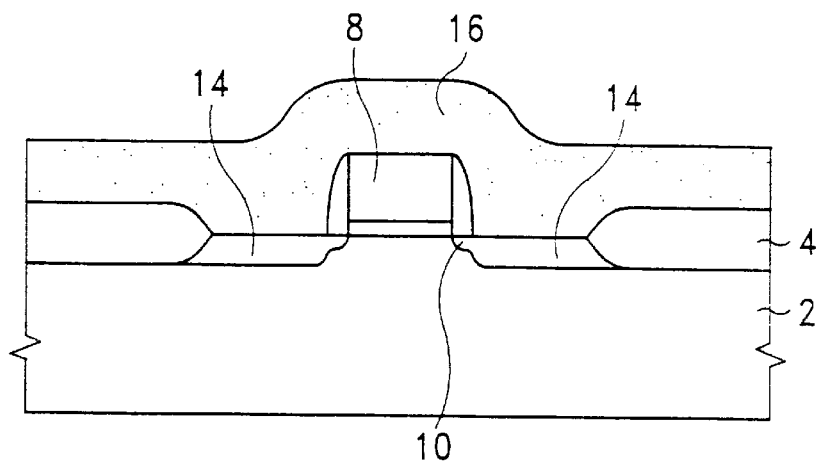
FIG. 2 is a cross section view of a semiconductor wafer illustrating the step of forming a silicon-rich metal silicide layer according to the present invention.

Turning to FIG. 2, subsequently, a silicon-rich metal silicide layer 16 is deposited on the gate structure and substrate 2 by using chemical vapor deposition. This metal silicide layer 16 is used as a silicon material source. The silicon-rich metal silicide layer 16 could be formed of tungsten silicide (WSi$_x$), wherein x≧2. Further, the TiSi$_2$ (TiSi$_x$) can also be used as the silicide according to the present invention, similarly x≧2. The typical reactions of the Wsi$_2$ and TiSi$_2$ are shown below.

$$WF_6 + SiH_4 \rightarrow WSi_2 + 6HF + H_2$$

$$TiCl_4 + 2SiH_4 \rightarrow TiSi_2 + 4HCl + 2H_2$$

The temperatures for forming the silicon-rich tungsten silicide (WSi$_x$) and silicon-rich titanium silicide (TiSi$_x$) are similar to conventional processes.

Figure 3:
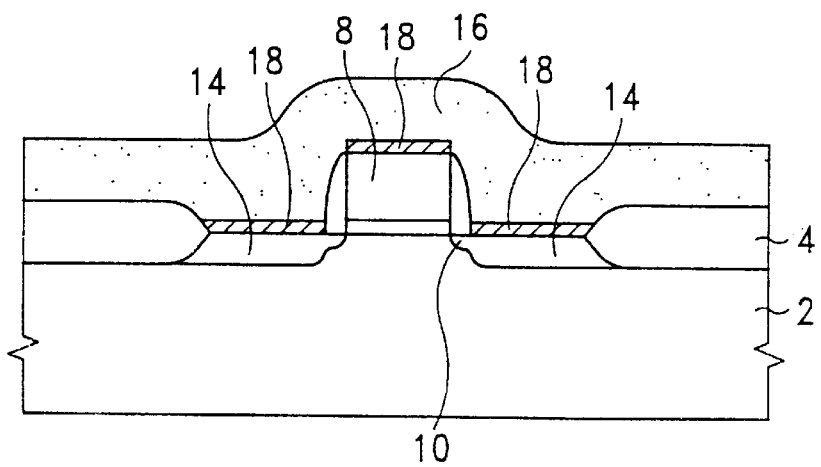
FIG. 3 is a cross section view of a semiconductor wafer illustrating the step of performing a thermal process to form a silicon layer according to the present invention.

Then, as shown in FIG. 3, a thermal process is carried out to separate a portion of the silicon out of the metal silicide layer 16. The separated silicon is then formed on top of the polysilicon gate 8, source/drain 14, thereby forming a silicon layer 18 on there regions. In a case, the thermal process is performed at a temperature about 1000 to 1100 degrees centigrade for about 30–60 seconds in N$_2$ or Ar gas environment. In the preferred embodiment, the thickness of the silicon layer 18 on the gate is about 300 to 600 angstroms, whereas the thickness of the silicon layer 18 on the source and drain is about 200 to 400 angstroms. It is because that the growing rate on the polysilicon is faster than the growing rate on the silicon.

Figure 4:
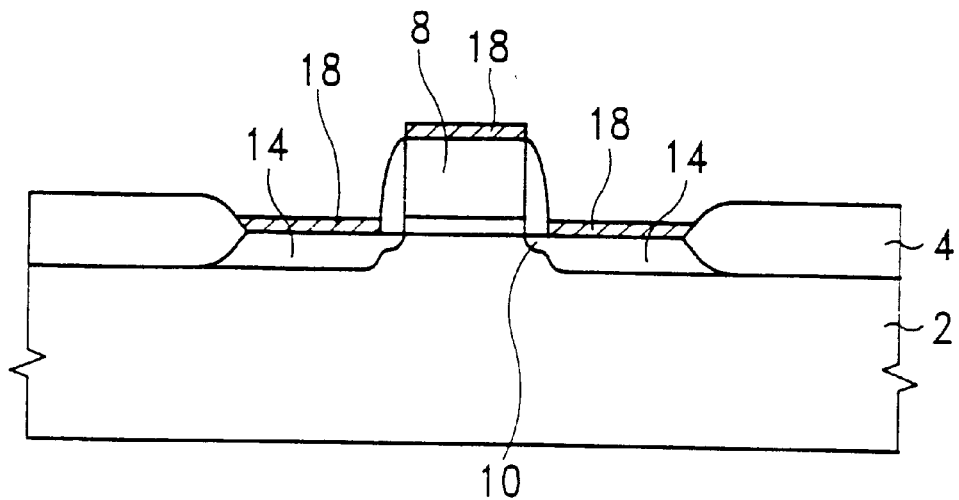
FIG. 4 is a cross section view of a semiconductor wafer illustrating the step of removing the metal silicide layer according to the present invention.

Turning to FIG. 4, the nest step is to remove the metal silicide layer 16 by using chemical solution. Thus, the silicon layer 18 is self-aligned formed on the source/drain 14 and the gate 18. Further, the silicon layer 18 is used to react with metal for forming subsequent silicide. Thus, the substrate will not react with the metal, therefore, the junction leakage issue will be eliminate by the self-aligned silicon layer 18.

Figure 5:
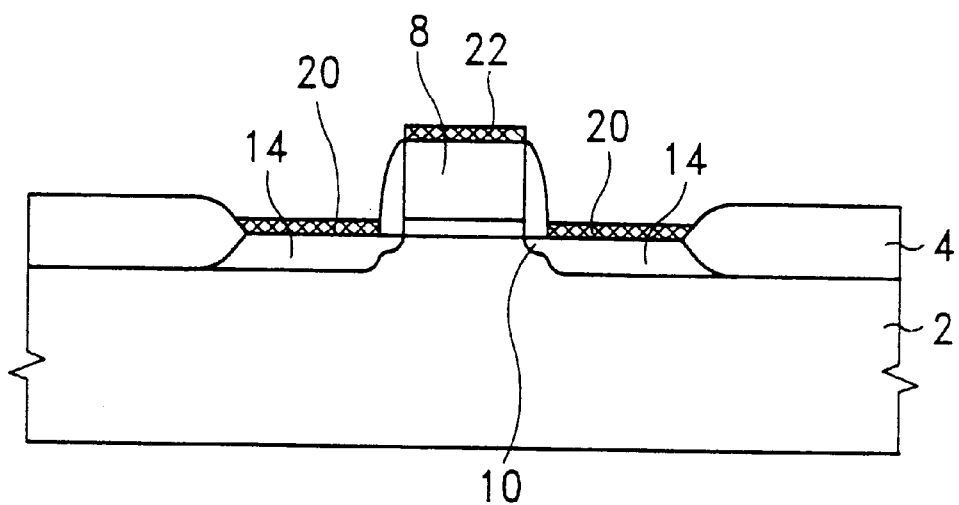
FIG. 5 is a cross section view of a semiconductor wafer illustrating the step of forming a self-aligned silicide layer, a polycide layer according to the present invention.

As shown in FIG. 5, self-aligned silicide (SALICIDE) layer 20, polycide layer 22 are respectively formed on the substrate (source and drain 14), gate 8. Typically, this can be achieved by using well known processes. For example, a metal layer, such as Ti, Pt, Co, W, Ni etc, is sputtered on the silicon layer 18 that is formed on the substrate 2, polysilicon gate 8. Then, a rapid thermal annealing (RTA) is performed at 350 to 700 centigrade degrees in N$_2$ ambient to react the metal with the self-aligned silicon layer 18, thereby forming self-aligned silicide 20, polycide 22 on these portions. Then, a strip step is used to remove non-reactive metal on the side-wall spacers 12. Therefore, the SALICIDE layer 20, polycide layer 22 are self-aligned formed on these regions.

Apparently, using the method described above, a self-aligned silicon layer could be formed on a silicon layer. For example, a silicon-rich metal silicide layer is formed on a silicon layer, first. Next, a thermal process is used as aforementioned to separated the silicon out of said silicon-rich metal silicide layer. Thus, the self-aligned silicon layer will be formed on the silicon layer by the present invention.

As will be understood by persons skilled in the art, the foregoing preferred embodiment of the present invention is illustrative of the present invention rather than limiting the present invention. Having described the invention in connection with a preferred embodiment, modification will now suggest itself to those skilled in the art. Thus, the invention is not to be limited to this embodiment, but rather the invention is intended to cover various modifications and similar arrangements included within the spirit and scope of the appended claims, the scope of which should be accorded the broadest interpretation so as to encompass all such modifications and similar structures.

While the preferred embodiment of the invention has been illustrated and described, it will be appreciated that various changes can be made therein without departing from the spirit and scope of the invention.

What is claimed is:

1. A method of forming a self-aligned silicon layer on a gate, a source and a drain of a metal oxide semiconductor transistor having side wall spacers on side walls of said gate, said method comprising the steps of:

forming said transistor on a semiconductor substrate;

forming a silicon-rich metal silicide layer on said gate, said side wall spacers and on said substrate by using chemical vapor deposition, said silicon-rich metal silicide layer being as a silicon material source;

performing a thermal process to separate a portion of silicon out of said silicon-rich metal silicide layer, thereby forming said self-aligned silicon layer on said gate, said source and drain; and removing said silicon-rich metal silicide layer.

2. The method of claim 1, wherein said silicon-rich metal silicide layer comprises silicon-rich tungsten silicide (WSi$_x$).

3. The method of claim 1, wherein said silicon-rich metal silicide layer comprises silicon-rich titanium silicide (TiSi$_x$).

4. The method of claim 2, wherein said x≧2.

5. The method of claim 3, wherein said x≧2.

6. The method of claim 1, wherein said thermal process is performed at a temperature about 1000 to 1100 degrees centigrade.

7. The method of claim 1, wherein said thermal process is performed for about 30 to 60 seconds.

8. The method of claim 1 wherein said thermal process is performed in an ambient comprising $N_2$.

9. The method of claim 1, wherein said thermal process is performed in an ambient comprising Ar.

10. A method of forming a self-aligned silicide, a polycide by using self-aligned silicon layer on a metal oxide semiconductor transistor having side wall spacers, said method comprising the steps of:

forming said transistor on a semiconductor substrate;

forming a silicon-rich metal silicide layer on a gate of said transistor, said side wall spacers and on said substrate by using chemical vapor deposition, said silicon-rich metal silicide layer being as a silicon material source;

performing a thermal process to separate a portion of silicon out of said silicon-rich metal silicide layer, thereby forming said self-aligned silicon layer on said gate, a source and a drain of said transistor;

removing said silicon-rich metal silicide layer;

forming a metal layer on said transistor and on said self-aligned silicon layer;

performing a rapid thermal annealing (RTP) process to react said metal layer with said self-aligned silicon layer, thereby forming said self-aligned silicide, said polycide on said source, said drain and said gate, respectively; and removing said metal layer that does not react with said self-aligned silicon layer.

11. The method of claim 10, wherein said silicon-rich metal silicide layer comprises silicon-rich tungsten silicide ($WSi_x$).

12. The method of claim 10, wherein said silicon-rich metal silicide layer comprises silicon-rich titanium silicide ($TiSi_x$).

13. The method of claim 11, wherein said $x \geq 2$.

14. The method of claim 12, wherein said $x \geq 2$.

15. The method of claim 10, wherein said thermal process is performed at a temperature about 1000 to 1100 degrees centigrade.

16. The method of claim 10, wherein said thermal process is performed for about 30 to 60 seconds.

17. The method of claim 10, wherein said thermal process is performed in an ambient comprising $N_2$.

18. The method of claim 10, wherein said thermal process is performed in an ambient comprising Ar.

19. A method of forming a self-aligned silicon layer on a silicon layer, said method comprising the steps of:

providing a silicon layer;

forming a silicon-rich metal silicide layer on said silicon layer by using chemical vapor deposition, said silicon-rich metal silicide layer being as a silicon material source;

performing a thermal process to separate a portion of silicon in said silicon-rich metal silicide layer out of said silicon-rich metal silicide layer, thereby forming said self-aligned silicon layer on said silicon layer; and removing said silicon-rich metal silicide layer.

20. The method of claim 19, wherein said silicon-rich metal silicide layer comprises silicon-rich tungsten silicide ($WSi_x$).

21. The method of claim 19, wherein said silicon-rich metal silicide layer comprises silicon-rich titanium silicide ($TiSi_x$).

22. The method of claim 20, wherein said $x \geq 2$.

23. The method of claim 21, wherein said $x \geq 2$.

24. The method of claim 19, wherein said thermal process is performed at a temperature about 1000 to 1100 degrees centigrade.

25. The method of claim 19, wherein said thermal process is performed for about 30 to 60 seconds.

26. The method of claim 19, wherein said thermal process is performed in an ambient comprising $N_2$.

27. The method of claim 19, wherein said thermal process is performed in an ambient comprising Ar.

* * * * *